(12) United States Patent
Agnaou et al.

(10) Patent No.: US 10,443,871 B2
(45) Date of Patent: Oct. 15, 2019

(54) METHOD AND SYSTEM FOR DETERMINING THE LEVEL OF EFFICIENCY OF A VENTILATION SYSTEM OF AN ELECTRICAL ENCLOSURE

(71) Applicant: Schneider Electric Industries SAS, Rueil-Malmaison (FR)

(72) Inventors: Abderrahmane Agnaou, Grenoble (FR); Josep Lopez, Barcelona (ES); Alain Perrin, Saint Nicolas de Macherin (FR); Philippe Cassan, Meylan (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 289 days.

(21) Appl. No.: 15/400,091

(22) Filed: Jan. 6, 2017

(65) Prior Publication Data
US 2017/0219230 A1    Aug. 3, 2017

(30) Foreign Application Priority Data

Jan. 29, 2016    (FR) ..................... 16 50704

(51) Int. Cl.
*F24F 11/00*   (2018.01)
*H05K 7/20*   (2006.01)
(Continued)

(52) U.S. Cl.
CPC ........ *F24F 11/0001* (2013.01); *H05K 7/1478* (2013.01); *H05K 7/20181* (2013.01);
(Continued)

(58) Field of Classification Search
CPC .................................................. F24F 11/0001
See application file for complete search history.

(56) References Cited

U.S. PATENT DOCUMENTS

| 6,319,114 | B1 | 11/2001 | Nair et al. | |
| 7,714,731 | B2 * | 5/2010 | Palaszewski | H05K 7/207 |
| | | | | 236/49.2 |

(Continued)

FOREIGN PATENT DOCUMENTS

EP    2 077 145 A1    7/2009

OTHER PUBLICATIONS

French Preliminary Search Report dated Oct. 10, 2016 in French Application 16 50704, filed on Jan. 29, 2016 ( with English translation of categories of Cited Documents).

*Primary Examiner* — Manuel L Barbee
*Assistant Examiner* — Raymond L Nimox
(74) *Attorney, Agent, or Firm* — Oblon, McClelland, Maier & Neustadt, L.L.P.

(57) ABSTRACT

A method for determining the level of efficiency of a ventilation system of an electrical enclosure intended to house one or more electrical devices, the method including a learning step including a step for determining a profile of the power dissipated via the Joule effect by each electrical device, an evaluation step for evaluating the level of efficiency of the ventilation system, including a step for determining the average air flow rate of a fan from a profile of the temperature of the air outside the enclosure obtained over an evaluation period, a profile of the temperature of the air at the outlet of the enclosure, and the dissipated power profile determined during the learning step, a step for comparing the average air flow rate with one or more threshold values in order to determine the level of efficiency of the ventilation system.

18 Claims, 2 Drawing Sheets

(51) Int. Cl.
*H05K 7/14* (2006.01)
*F24F 140/50* (2018.01)
*F24F 140/60* (2018.01)
*F24F 11/32* (2018.01)
*F24F 11/52* (2018.01)
*F24F 11/39* (2018.01)
*F24F 11/47* (2018.01)

(52) U.S. Cl.
CPC .......... *H05K 7/20272* (2013.01); *F24F 11/32* (2018.01); *F24F 11/39* (2018.01); *F24F 11/47* (2018.01); *F24F 11/52* (2018.01); *F24F 2140/50* (2018.01); *F24F 2140/60* (2018.01)

(56) References Cited

U.S. PATENT DOCUMENTS

| | | | |
|---|---|---|---|
| 9,677,772 B2 * | 6/2017 | Siegel | F24C 15/2021 |
| 2006/0151165 A1 * | 7/2006 | Poirier | F24F 12/006 |
| | | | 165/247 |
| 2010/0286831 A1 * | 11/2010 | Boudreau | F24F 12/006 |
| | | | 700/278 |
| 2011/0295524 A1 | 12/2011 | Tada et al. | |
| 2011/0316706 A1 | 12/2011 | Cash et al. | |
| 2013/0171922 A1 * | 7/2013 | Jensen | F24F 11/0001 |
| | | | 454/239 |
| 2013/0197829 A1 * | 8/2013 | Sherman, III | B01D 46/0086 |
| | | | 702/45 |
| 2017/0280594 A1 * | 9/2017 | Sato | G05B 15/02 |

* cited by examiner

METHOD AND SYSTEM FOR DETERMINING THE LEVEL OF EFFICIENCY OF A VENTILATION SYSTEM OF AN ELECTRICAL ENCLOSURE

TECHNICAL FIELD OF THE INVENTION

The present invention relates to a method for determining the level of efficiency of a ventilation system of an electrical enclosure. The invention also relates to a system for determining the level of efficiency of a ventilation system of an electrical enclosure.

PRIOR ART

For reasons of energy efficiency, nowadays it is necessary to take into account the electrical energy which is used for dissipation of the heat generated by electrical devices housed inside an electrical enclosure, such as a switching cabinet. For this heat dissipation the electrical enclosure comprises a ventilation system having:
- an air inlet via which air is injected into the electrical enclosure;
- at least one fan intended to assist injection of the air into the enclosure in order to cool the electrical devices;
- an air outlet for evacuating the hot air outside of the enclosure;
- a filter positioned at the air inlet of the enclosure and used to prevent dust or other polluting particles being conveyed inside the enclosure.

The filter is for example composed of a cellular material intended to capture the particles entering from outside during injection of the air into the enclosure and thus ensuring the injection of "clean" air into the electrical enclosure. In order to ensure efficient cooling of the electrical devices, there must always be a sufficient amount of incoming air flow. Soiling of the air inlet filter, malfunctioning of the fan or some other factor may result in an impairment of this air flow and therefore a deterioration of the level of efficiency of the ventilation system. For example, in the event of soiling of the filter, two different situations may occur:
- In a first situation, the air flow becomes insufficient and the electrical devices will have the tendency to heat up, which may result in malfunctioning, stoppages or breakdown in the event of overheating.
- In a second situation, the air flow necessary for correctly cooling the electrical devices housed inside the enclosure is maintained, but stresses the fan to a greater degree, and this in the long run may affect its working life.

It is therefore necessary to take into account the level of efficiency of the ventilation system and in particular the level of soiling of the air inlet filter, before one of the two situations described above occurs. For this purpose, periodic checking of the level of efficiency of the ventilation system is desirable. As regards the air inlet filter, this check may be carried out by an operator who extracts the filter from its housing and checks its soiled state. However, this method has proved to be too restrictive and difficult to implement in installations which have a large number of electrical enclosures. There therefore exist electronic solutions which allow the degree of soiling of the filter to be determined and this soiling level to be visually indicated to the operator. Determination of the soiling level must in this case be as simple and reliable as possible, using a minimum number of sensors.

The object of the invention is to propose a method for determining the level of efficiency of a ventilation system of an electrical enclosure, this method being simple to implement and using a minimum number of sensors and sensors which are simple and robust.

SUMMARY OF THE INVENTION

This object is achieved by a method for determining the level of efficiency of a ventilation system of an electrical enclosure intended to house one or more electrical devices, said ventilation system comprising an air inlet, at least one fan for assisting injection of air inside the enclosure with a view to cooling each electrical device, an air inlet filter designed to filter the air injected inside the enclosure and an air outlet designed to allow evacuation of the hot air outside the enclosure, said method comprising:
- a learning step comprising a step for determining a profile of the power dissipated by the Joule effect inside the electrical enclosure by each electrical device, during a learning period,
- an evaluation step for evaluating the level of efficiency of the ventilation system, comprising:
- a step for determining the average air flow rate of the fan over an evaluation period, from a profile of the temperature of the air outside the enclosure obtained over said evaluation period, a profile of the temperature of the air at the outlet of the enclosure and said dissipated power profile determined during the learning step,
- a step for comparing the average air flow rate determined over said evaluation period with one or more threshold values in order to determine the level of efficiency of the ventilation system.

According to a particular feature, the method comprises a step of collecting data relating to the temperature of the air outside the enclosure during the learning period at given collection instants separated by a regular time interval.

According to another particular feature, the method comprises a step of collecting data relating to temperatures of the air at the outlet of the enclosure during the learning period at given collection instants separated by said regular time interval.

According to another particular feature, the profile of the power dissipated via the Joule effect by the electrical devices is obtained from the instantaneous power values determined for each collection instant of the learning period, each instantaneous power value being determined from the temperature of the air at the outlet of the enclosure at the collection instant of the learning period, the temperature of the air outside the enclosure at said collection instant of the learning period and an initial air flow rate of the fan.

According to another particular feature, the method comprises a step of collecting data relating to temperatures of the air outside the enclosure during the learning period at given collection instants separated by a regular time interval.

According to another particular feature, the method comprises a step of collecting data relating to temperatures of the air at the outlet of the enclosure during the evaluation period at given collection instants separated by said regular time interval.

According to another particular feature, during the evaluation step, it comprises a step for determining the instantaneous air flow rate of the fan at each of the collection instants of the evaluation period, from the power dissipated via the Joule effect by the electrical devices housed inside the enclosure and determined during the learning step at a corresponding instant of the learning period, the temperature of the air outside the enclosure measured at said instant, and the temperature of the air at the outlet of the enclosure measured at said instant.

According to another particular feature, the average flow rate corresponds to the average of the instantaneous flow rates determined at each instant when the fan is in operation.

According to another particular feature, the threshold values are fixed based on an initial air flow rate of the fan.

The invention also concerns a system for determining the level of efficiency of a ventilation system for an electrical enclosure intended to house one or more electrical devices, said ventilation system comprising an air inlet, at least one fan for assisting injection of air inside the enclosure in order to cool each electrical device, an air inlet filter designed to filter the air injected inside the enclosure and an air outlet designed to allow evacuation of the hot air outside the enclosure, said determination system comprising a processing unit which comprises:

- a learning module comprising a module for determining a profile of the power dissipated by the Joule effect inside the electrical enclosure by each electrical device, during a learning period,
- an evaluation module for evaluating the level of efficiency of the ventilation system, comprising:
  - a module for determining the average air flow rate of the fan over an evaluation period, from a profile of the temperature of the air outside the enclosure obtained over said evaluation period, a profile of the temperature of the air at the outlet of the enclosure, and said dissipated power profile determined during the learning step,
  - a module for comparing the average air flow rate determined over said evaluation period with one or more threshold values in order to determine the level of efficiency of the ventilation system.

According to a particular feature, the processing unit is designed to collect data relating to temperatures of the air outside the enclosure during the learning period at given collection instants separated by a regular time interval.

According to another particular feature, the processing unit is designed to collect data relating to temperatures of the air at the outlet of the enclosure during the learning period at given collection instants separated by said regular time interval.

According to another particular feature, the profile of the power dissipated via the Joule effect by the electrical devices is obtained from the instantaneous power values determined for each collection instant of the learning period, each instantaneous power value being determined by a module from the temperature of the air at the outlet of the enclosure at a collection instant of the learning period, the temperature of the air outside the enclosure at said collection instant of the learning period, and an initial air flow rate of the fan.

According to another particular feature, the processing unit is designed to collect data relating to temperatures of the air outside the enclosure (1) during the learning period at given collection instants separated by a regular time interval.

According to another particular feature, the processing unit is designed to collect data relating to temperatures of the air at the outlet of the enclosure during the evaluation period at given collection instants separated by said regular time interval.

According to another particular feature, the evaluation module comprises a module for determining the instantaneous air flow rate of the fan at each of the collection instants of the evaluation period, from the power dissipated via the Joule effect by the electrical devices housed inside the enclosure and determined during the learning step at a corresponding instant of the learning period, the temperature of the air outside the enclosure measured at said instant, and the temperature of the air at the outlet of the enclosure measured at said instant.

According to another particular feature, the average flow rate corresponds to the average of the instantaneous flow rates determined at each instant when the fan is in operation.

According to another characteristic feature, the threshold values are fixed based on an initial air flow rate of the fan.

BRIEF DESCRIPTION OF THE FIGURES

Other characteristic features and advantages will become clear from the following detailed description provided with reference to the accompanying drawings in which.

DETAILED DESCRIPTION OF AT LEAST ONE EMBODIMENT

The invention concerns a method and a system for determining the level of efficiency of the ventilation system of an electrical enclosure.

Figure 1:
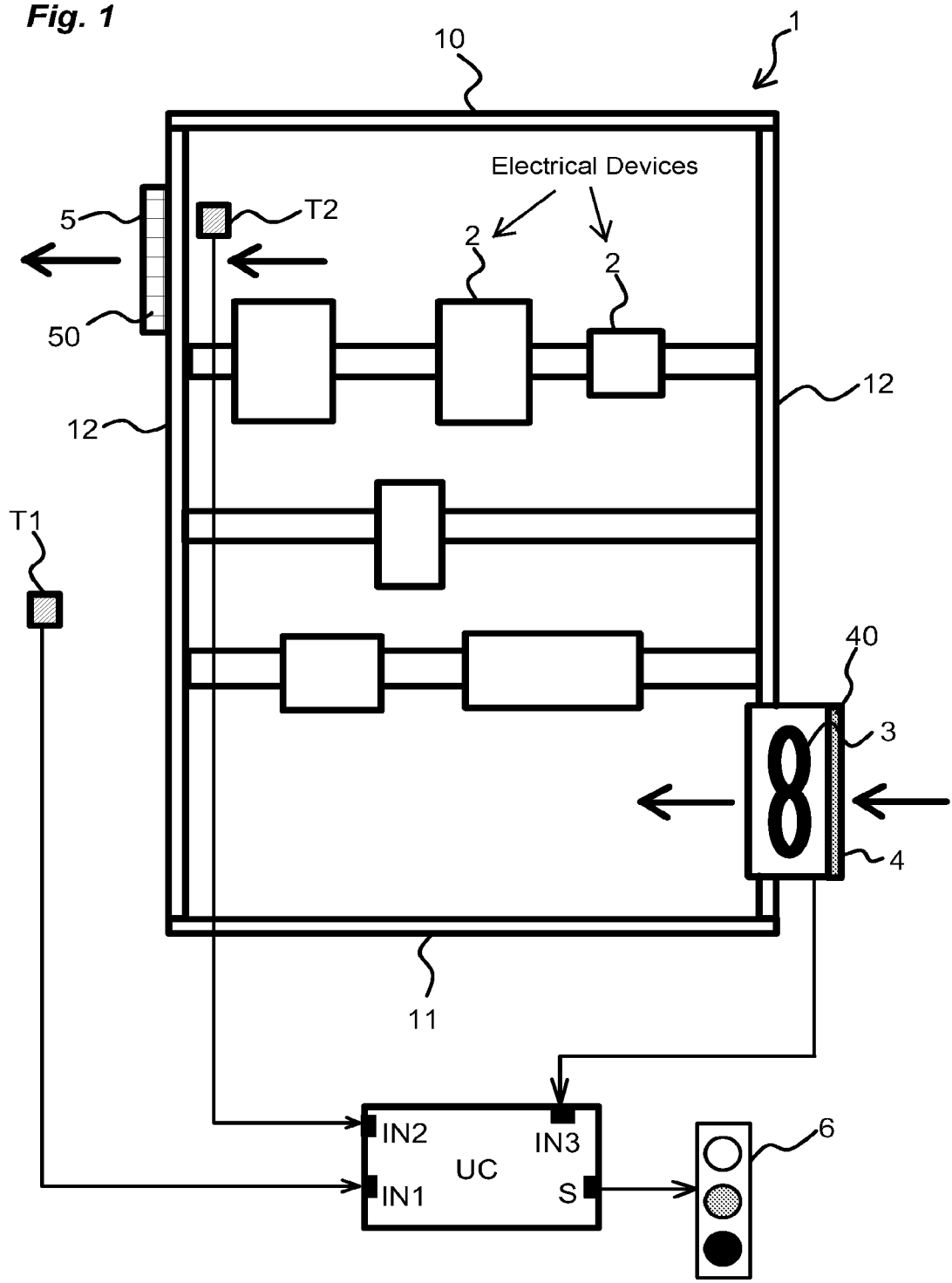
FIG. 1 shows in schematic form the architecture of an electrical enclosure and the system for determining the level of efficiency of the ventilation system used in the enclosure, the enclosure being shown in a front elevation view.

With reference to FIG. 1, this shows by way of example an electrical enclosure 1 which has a parallelepiped shape comprising a top wall 10, a bottom wall and four side walls 12 arranged opposite each other in pairs. Of course, the method and the system according to the invention may be adapted to all types and all forms and sizes of electrical enclosures.

The electrical enclosure 1 is intended to house electrical devices 2 and comprises a ventilation system which has:

- An air inlet 4 via which air is injected inside the electrical enclosure 1.
- An air outlet 5 for evacuating the hot air outside the electrical enclosure.
- At least one fan 3 positioned at the air inlet or the air outlet. When, it is activated, the fan assists the injection of air inside the enclosure 1 by means of forced delivery when it is situated at the air inlet or by means of suction when it is situated at the air outlet.
- An air inlet filter 40 positioned at the air inlet, upstream of the fan 3 relative to the direction of injection of the air when the fan is at the inlet, in order to filter the air injected into the electrical enclosure 1. This filter 40 comprises for example a cellular structure able to capture the impurities and prevent them from penetrating inside the enclosure.

FIG. 1 shows the air inlet and air outlet in the two opposite side walls of the enclosure which are transverse relative to the plane of the drawing of the enclosure in a front elevation view. Of course it must be understood that they could be positioned in the two other opposite side walls situated in the planes parallel to the plane of the drawing viewed in front elevation. Likewise, the air inlet or the air outlet could be positioned on the top wall and the air outlet or air inlet respectively positioned on the wall of the cabinet so as to allow an air flow to all the electrical devices housed inside the enclosure.

A first grille (not shown) associated with said filter 40 may be positioned on the air inlet. Likewise, a second grille 50 may be positioned on the air outlet.

The system according to the invention which allows the level of efficiency of this ventilation system to be determined comprises:

- A first temperature sensor T1 positioned outside the enclosure so as to measure the ambient temperature of the room in which the electrical enclosure 1 is situated.
- A second temperature sensor T2 positioned inside the enclosure 1 so as to measure the temperature of the air which exits towards the outside of the electrical enclosure.
- A processing unit UC comprising in particular a microcontroller intended to determine the level of efficiency of the ventilation system and comprising:
    A first inlet IN1 to which the first temperature sensor T1 is connected in order to receive the data measured by this sensor.
    A second inlet IN2 to which the second temperature sensor T2 is connected in order to receive the data measured by this sensor.
    A third inlet IN3 receiving the state (0/1) of the fan, namely the data representing the working state or stopped state of the fan. This third inlet IN3 assumes the value 1 if the fan is in the working state or the value 0 if the fan is in the stopped state. This data may also be already available to the processing unit if it is programmed to control start-up of the fan 3.
    At least one outlet S to which a signal representing the level of efficiency of the ventilation system may be sent. A signalling unit 6, of the visual, sound or other type, will be for example connected to said outlet S in order to indicate the level of efficiency of the ventilation system.

Preferably, as shown in FIG. 1, the system according to the invention will be particularly efficient with the following architecture:

- An air inlet 4 positioned on the bottom part or top part of a side wall 12 of the enclosure,
- An air outlet 5 positioned, respectively on the top part or bottom part, of a side wall 12, on the opposite side to the air inlet 4,
- The second temperature sensor T2 positioned inside the enclosure 1 at the air outlet, upstream of the outlet grille, in order to measure the temperature of the air which flows out of the electrical enclosure. This sensor T2 may be situated inside or outside the enclosure.

Of course, other arrangements, which are also effective, may be provided, with similar results.

Figure 2:
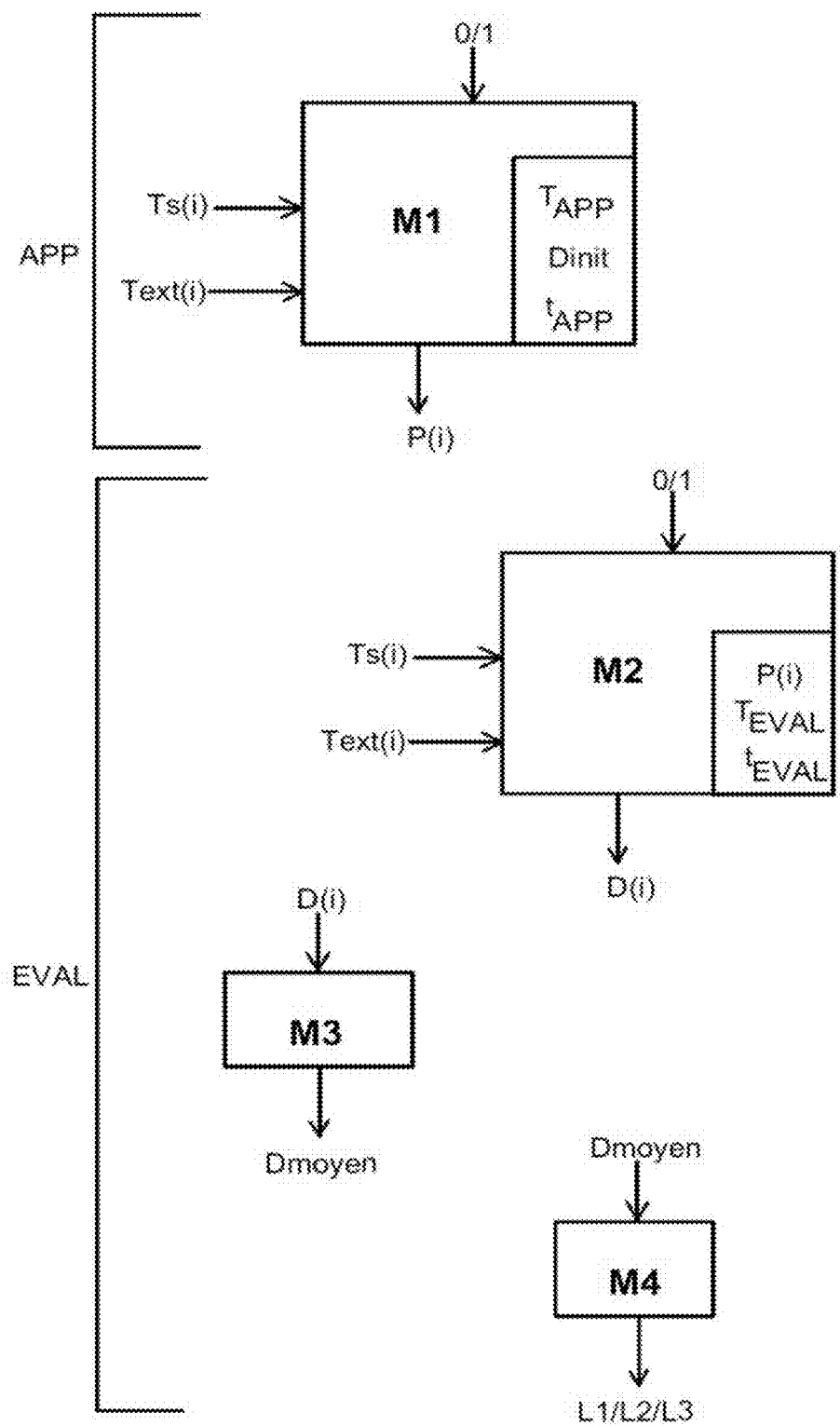
FIG. 2 shows a diagram illustrating the different steps of the method for determining the level of efficiency of the ventilation system.

Based on the system as described above, the method according to the invention, implemented by means of the system according to the invention, comprises two separate steps, i.e. a learning step (APP) and an evaluation step (EVAL) for evaluating the degree of soiling. FIG. 2 shows the different operating steps of the system according to the invention.

Learning Step (APP)

The learning step is performed by a learning logic module of the processing unit UC and is intended to determine a profile of the power dissipated via the Joule effect by the electrical devices 2 present in the enclosure over a learning period $T_{APP}$ of given duration. This learning period $T_{APP}$ has, for example, a duration of 24 hours so as to be able to cover all the operating cycles of the electrical devices 2 present in the enclosure 1.

During the learning period, the processing unit UC recovers, at its first inlet IN1 and its second inlet IN2, temperature data at several successive instants during the learning period, respectively originating from the first temperature sensor T1 and the second temperature sensor T2. The instants for collecting the temperature data are preferably separated by a regular time interval $t_{app}$, for example fixed at 10 seconds. The collection of the data may be controlled by the processing unit UC or by each temperature sensor after temporal synchronization with the processing unit UC.

Thus, the processing unit UC stores the temperature data for each collection instant i (i ranging from 1 to n and n being equal to 8640 with a learning period of 24 hours and a time interval of 10 seconds). The processing unit thus stores:

$$T_{ext}(t) = [T_{ext}(1), T_{ext}(2), T_{ext}(3), T_{ext}(4), \ldots, T_{ext}(n)]$$

$$T_g(t) = [T_g(1), T_g(2), T_g(3), T_g(4), \ldots, T_g(n)]$$

For each a first logic module M1 of the learning modules determines the instantaneous power dissipated via the Joule effect by the electrical devices housed inside the enclosure. For this purpose, the processing unit proceeds in the following manner:

For i=1 to i=n,
If IN3=1, then the dissipated power equal to:

$$P(t) = D_{init} \times \left[ \frac{T_s(t) - T_{ext}(t)}{3} \right]$$

Otherwise:

$$P(t) = 0$$

In which $D_{init}$ corresponds to the initial flow rate of the fan 3 in m³/s. This initial flow rate will be for example indicated in the specifications of the fan 3.

Once the instantaneous dissipated power values have been calculated for each measurement instant i over the learning period $T_{APP}$, this data is stored by the processing unit UC so that it may be used during each step for evaluating the level of efficiency of the ventilation system of the electrical enclosure.

Evaluation Step (EVAL)

An evaluation step EVAL is performed by an evaluation logic module of the processing unit UC and consists in determining the level of efficiency of the ventilation system. It is for example performed over an evaluation period $T_{EVAL}$, preferably with a duration identical to the learning duration. It will therefore last, for example, 24 hours.

During the evaluation period, the processing unit UC recovers, at its first inlet IN1 and its second inlet IN2, temperature data at several successive instants during the learning period, respectively originating from the first temperature sensor T1 and the second temperature sensor T2. The instants for collecting the temperature data are separated by a regular time interval $t_{EVAL}$ identical to that used during the learning step which is for example fixed at 10 seconds.

Thus, the processing unit UC stores the temperature data for each collection instant i (i ranging from 1 to n and n being equal to 8640 with a learning period of 24 hours and a time interval of 10 seconds). The processing unit thus stores:

$$T_{ext}(t) = [T_{ext}(1), T_{ext}(2), T_{ext}(3), T_{ext}(4), \ldots, T_{ext}(n)]$$

$$T_g(t) = [T_g(1), T_g(2), T_g(3), T_g(4), \ldots, T_g(n)]$$

Then a second logic module M2 of the evaluation module determines the instantaneous air flow rate of the fan 3 for each measurement instant i in the following manner:

For i=1 to i=n,

If IN3=1, then the air flow rate D(i) is equal to:

$$D(t)=3\times[P(t)/(T_s(t)-T_{ext}(t))]$$

Otherwise:

$$D(t)=0$$

with P(t) which corresponds to the power dissipated by the Joule effect determined during the learning step for the same instant i of the learning period.

Preferably, the processing unit UC performs a step for synchronization of the data of the power profile determined during the learning step with the temperature values collected during the evaluation step. The synchronization will be performed for example by aligning the maximum values of the power profile with the maximum values of temperatures measured by the second temperature sensor.

In order to determine the efficiency level of the ventilation system, a third module M3 of the evaluation module determines an average flow rate $D_{moyen}$ which is calculated on the basis of the non-zero instantaneous flow rates determined at each instant i. For all the values of D(t)≠0 obtained when the fan is in operation, this average flow rate is equal to the following:

$$D_{moyen} = \sum_{1}^{n} D(i)/N$$

with N which corresponds to the number of values where the fan is in operation.

Based on the given average flow rate, a fourth logic module M4 of the evaluation module determines the level of efficiency of the ventilation system of the electrical enclosure. For this purpose, it performs a step for comparing the average flow rate $D_{moyen}$ obtained with one or more threshold values. These threshold values are for example determined on the basis of the initial flow rate $D_{init}$ mentioned above. For example, the fourth logic module M4 of the processing unit UC performs the following tests:

If $D_{moyen} > D_{init} \times 70\%$ the air filtration system is functioning correctly, corresponding to a first level L1 of efficiency of the ventilation system.

If $Dinit \times 40\% < D_{moyen} < D_{init} \times 70\%$ then the air filtration system has an average operating level, corresponding to a second level L2 of efficiency of the ventilation system and the fact that action will be needed shortly in order to determine the cause of the associated inefficiency of the system.

If $D_{moyen} < D_{init} \times 40\%$ then the air filtration system is not functioning correctly, corresponding to a third level L3 of efficiency of the ventilation system of the enclosure and to the fact that action is required in order to determine the cause of the inefficiency of the system.

Of course, other threshold values could be employed, depending on the installation requirements.

Depending on the level of efficiency (L1 , L2 or L3 ) determined, the processing unit UC may for example cause a separate light indicator of the signalling unit 6 to light up.

The method and the system according to the invention thus offer numerous advantages including:

Detection of the level of efficiency of the ventilation system which is simple because it uses a minimum number of sensors.

Detection which is reliable because the sensors employed are simple temperature sensors.

A less costly solution because it uses a small number of sensors and requires a limited processing capacity.

The invention claimed is:

1. A method for determining the level of efficiency of a ventilation system of an electrical enclosure to house one or more electrical devices, said ventilation system comprising an air inlet, at least one fan for assisting injection of air inside the enclosure in order to cool each electrical device, an air inlet filter designed to filter the air injected inside the enclosure and an air outlet designed to allow evacuation of the hot air outside the enclosure, said method comprising:

determining a profile of the power dissipated by the Joule effect inside the electrical enclosure by each electrical device, during a learning period;

evaluating the level of efficiency of ventilation system, by:

determining the average air flow rate of the fan over an evaluation period from a profile of the temperature of the air outside the enclosure obtained over said evaluation period, a profile of the temperature of the air at the outlet of the enclosure, and said dissipated power profile determined during the learning step, and comparing the average air flow rate determined over said evaluation period with one or more threshold values in order to determine the level of efficiency of the ventilation system; and outputting an indicator of the determined level of efficiency of the ventilation system.

2. A determination method according to claim 1, comprising collecting data relating to temperatures of the air outside the enclosure during the learning period at given collection instants separated by a regular time interval.

3. A determination method according to claim 2, comprising collecting data relating to temperatures of the air at the outlet of the enclosure during the learning period at given collection instants separated by said regular time interval.

4. A determination method according to claim 3, wherein the profile of the power dissipated via the Joule effect by the electrical devices is obtained from the instantaneous power values determined for each collection instant of the learning period, each instantaneous power value being determined from the temperature of the air at the outlet of the enclosure at a collection instant of the learning period, the temperature of the air outside the enclosure at said collection instant of the learning period, and an initial air flow rate of the fan.

5. A determination method according to claim 1, comprising collecting data relating to temperatures of the air outside the enclosure during the evaluation period at given collection instants separated by a regular time interval.

6. A determination method according to claim 5, comprising collecting data relating to temperatures of the air at the outlet of the enclosure during the evaluation period at given collection instants separated by said regular time interval.

7. A determination method according to claim 6, wherein, during the evaluating, said method comprises determining the instantaneous air flow rate of the fan at each of the collection instants of the evaluation period, from the power dissipated via the Joule effect by the electrical devices housed inside the enclosure and determined during the learning step at a corresponding instant of the learning period, the temperature of the air outside the enclosure measured at said instant, and the temperature of the air at the outlet of the enclosure measured at said instant.

8. A determination method according to claim 7, wherein the average flow rate corresponds to the average of the instantaneous flow rates determined at each instant when the fan is in operation.

9. A determination method according to claim 1, wherein the threshold values are fixed based on an initial air flow rate of the fan.

10. A system for determining the level of efficiency of a ventilation system of an electrical enclosure intended to house one or more electrical devices, said ventilation system comprising an air inlet, at least one fan for assisting injection of air inside the enclosure in order to cool each electrical device, an air inlet filter designed to filter the air injected inside the enclosure and an air outlet designed to allow evacuation of the hot air outside the enclosure, comprising:
processing circuitry configured to
determine a profile of the power dissipated by the Joule effect inside the electrical enclosure by each electrical device, during a learning period,
evaluate the level of efficiency of the ventilation system, by:
determining the average air flow rate of the fan over an evaluation period from a profile of the temperature of the air outside the enclosure obtained over said evaluation period, a profile of the temperature of the air at the outlet of the enclosure, and said dissipated power profile determined during the learning step, and
comparing the average air flow rate determined over said evaluation period with one or more threshold values in order to determine the level of efficiency of the ventilation system; and
output an indicator of the determined level of efficiency of the ventilation system.

11. A determination system according to claim 10, wherein the processing circuitry is configured to collect data relating to temperatures of the air outside the enclosure during the learning period at given collection instants separated by a regular time interval.

12. A determination system according to claim 11, wherein the processing circuitry is configured to collect data relating to temperatures of the air at the outlet of the enclosure during the learning period at given collection instants separated by said regular time interval.

13. A determination system according to claim 12, wherein the profile of the power dissipated via the Joule effect by the electrical devices is obtained from the instantaneous power values determined for each collection instant of the learning period, each instantaneous power value being determined by a module from the temperature of the air at the outlet of the enclosure at a collection instant of the learning period, the temperature of the air outside the enclosure at said collection instant of the learning period, and an initial air flow rate of the fan.

14. A determination system according to claim 10, wherein the processing circuitry is configured to collect data relating to temperatures of the air outside the enclosure during the evaluation period at given collection instants separated by a regular time interval.

15. A determination system according to claim 14, wherein the processing circuitry is configured to collect data relating to temperatures of the air at the outlet of the enclosure during the evaluation period at given collection instants separated by said regular time interval.

16. A determination system according to claim 15, wherein the the processing circuitry is further configured to determine the instantaneous air flow rate of the fan at each of the collection instants of the evaluation period, from the power dissipated via the Joule effect by the electrical devices housed inside the enclosure and determined during learning at a corresponding instant of the learning period, the temperature of the air outside the enclosure measured at said instant, and the temperature of the air at the outlet of the enclosure measured at said instant.

17. A determination system according to claim 16, wherein the average flow rate rate corresponds to the average of the instantaneous flow rates determined at each instant when the fan is in operation.

18. A determination system according to claim 10, wherein the threshold values are fixed based on an initial air flow rate of the fan.

* * * * *